(12) United States Patent
Carlson et al.

(10) Patent No.: US 11,981,999 B2
(45) Date of Patent: May 14, 2024

(54) SUPPLEMENTAL ENERGY FOR LOW TEMPERATURE PROCESSES

(71) Applicant: Applied Materials, Inc., Santa Clara, CA (US)

(72) Inventors: David K. Carlson, San Jose, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 17/525,426

(22) Filed: Nov. 12, 2021

(65) Prior Publication Data

US 2022/0162756 A1 May 26, 2022

Related U.S. Application Data

(60) Provisional application No. 63/118,142, filed on Nov. 25, 2020.

(51) Int. Cl.
| | |
|---|---|
| *C23C 16/48* | (2006.01) |
| *C23C 14/34* | (2006.01) |
| *C23C 14/54* | (2006.01) |
| *C23C 16/52* | (2006.01) |
| *H01L 21/268* | (2006.01) |

(52) U.S. Cl.
CPC ........ *C23C 16/482* (2013.01); *C23C 14/3435* (2013.01); *C23C 14/541* (2013.01); *C23C 16/52* (2013.01); *H01L 21/2686* (2013.01)

(58) Field of Classification Search
None
See application file for complete search history.

(56) References Cited

U.S. PATENT DOCUMENTS

| | | | |
|---|---|---|---|
| 9,831,174 B1 * | 11/2017 | Zhang | ............... H01L 21/28556 |
| 2007/0218644 A1 | 9/2007 | Balakrishna et al. | |
| 2009/0120924 A1 * | 5/2009 | Moffatt | .............. B23K 26/0626 |
| | | | 219/385 |
| 2011/0300676 A1 | 12/2011 | Schroder et al. | |

(Continued)

FOREIGN PATENT DOCUMENTS

WO  2012108900 A1  8/2012

OTHER PUBLICATIONS

International Search Report and Written Opinion dated Mar. 7, 2022 for Application No. PCT/US2021/059158.

*Primary Examiner* — Shamim Ahmed
*Assistant Examiner* — Bradford M Gates
(74) *Attorney, Agent, or Firm* — Patterson + Sheridan, LLP

(57) ABSTRACT

Embodiments of the present disclosure generally relate to semiconductor processing, and specifically to methods and apparatus for surface modification of substrates. In an embodiment, a substrate modification method is provided. The method includes positioning a substrate within a processing chamber; and depositing a material on a portion of the substrate by a deposition process, wherein the deposition process comprises: thermally heating the substrate to a temperature of less than about 500° C.; delivering a first electromagnetic energy from an electromagnetic energy source to the substrate to modify a first region of the substrate, the first region of the substrate being at or near an upper surface of the substrate; and depositing a first material on the first region while delivering the first electromagnetic energy.

23 Claims, 4 Drawing Sheets

(56) References Cited

U.S. PATENT DOCUMENTS

2015/0128860 A1\* 5/2015 Canizares ............... C30B 25/16
　　　　　　　　　　　　　　　　　　　　　118/712
2016/0276227 A1　9/2016 Dickerson et al.
2017/0278761 A1　9/2017 deVilliers \* cited by examiner

SUPPLEMENTAL ENERGY FOR LOW TEMPERATURE PROCESSES

CROSS-REFERENCES TO RELATED APPLICATIONS

This application claims priority to U.S. Provisional Patent Application No. 63/118,142, filed Nov. 25, 2020, which is incorporated herein by reference in its entirety.

BACKGROUND

Field

Embodiments of the present disclosure generally relate to semiconductor processing, and specifically to methods and apparatus for surface modification of substrates.

Description of the Related Art

Various processes, such as advanced epitaxial processes, operate at low temperatures where surface modification, defect control, and growing heterojunction films is challenging. State-of-the-art systems also suffer from pattern-loading effects which occur due to a difference in pattern densities. As an example, a difference in epitaxial film-growth rates occurs when simultaneously growing films in a region of a higher pattern density and a region of lower pattern density. Consequently, the amount of film growth at specific locations becomes locally sparse or dense depending on the local pattern density of the film, causing significant and undesirable non-uniformities in the thickness of the grown film. Further, 3-nm and 5-nm technology nodes require across-the-die uniformities that are difficult to achieve with existing systems. As device geometries shrink to enable faster integrated circuits, the thermal budget for deposited films must be reduced in order to obtain satisfactory processing results, good production yield and robust device performance.

State-of-the-art systems typically utilize either double-sided heating, where the substrate is heated from both the device-side and the non-device side, or single-sided heating. Such heating systems, and particularly for forming very small device features, however do not allow control over the surface chemistry of films (e.g., aiding in the adsorption and/or desorption of precursors) during substrate processing. That is, defect control is virtually impossible while staying within thermal budgets.

There is a need for new and improved apparatus and methods for surface modification at low temperatures that overcome the aforementioned deficiencies.

SUMMARY

Embodiments of the present disclosure generally relate to semiconductor processing, and specifically to methods and apparatus for surface modification of substrates.

In an embodiment, a substrate modification method is provided. The method includes positioning a substrate within a processing chamber; and depositing a material on a portion of the substrate by a deposition process, wherein the deposition process comprises: thermally heating the substrate to a temperature of less than about 500° C.; delivering a first electromagnetic energy from an electromagnetic energy source to the substrate to modify a first region of the substrate, the first region of the substrate being at or near an upper surface of the substrate; and depositing a first material on the first region while delivering the first electromagnetic energy.

In another embodiment, a method of processing a substrate is provided. The method includes positioning the substrate within a processing chamber; and depositing a layer on a portion of the substrate. The depositing a layer on a portion of the substrate comprises: thermally heating the substrate to a temperature of less than about 500° C.; delivering a first electromagnetic energy from an electromagnetic energy source to the substrate to modify a first region at or near an upper surface of the substrate; depositing a first layer on the first region while delivering the first electromagnetic energy; delivering a second electromagnetic energy from the electromagnetic energy source to the substrate to modify a second region at or near an upper surface of the substrate, the second region and the first region being the same or different region; and depositing a second layer on the second region while delivering the first electromagnetic energy.

In another embodiment, an apparatus for modifying a surface of a substrate is provided. The apparatus includes a substrate processing chamber; a thermal heating source to heat the substrate at a temperature of less than about 500° C., the thermal heating source configured to heat a backside of the substrate; and an electromagnetic energy source to emit electromagnetic energy during a deposition process, the electromagnetic energy configured to modify a deposition precursor, a region at or near an upper surface of the substrate, or both, during the deposition process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to semiconductor processing, and specifically to methods and apparatus for surface modification of substrates. The inventors have found new and improved methods and apparatus that enable surface modification of semiconductor substrates at, e.g., low temperatures. Briefly, and in some examples, an electromagnetic energy source, such as a UV lamp array, a pulsed lamp array, or a light emitting diode (LED) assembly, is used to control, e.g., the surface chemistry during substrate processing. The electromagnetic energy source enables, e.g., reactions to occur on the substrate surface without having to heat the wafer at high temperatures. For example, adsorption and desorption of gas molecules can occur at lower temperatures by utilizing the electromagnetic energy source. As a result, the supplemental energy from the electromagnetic energy source enables a broader process window for low-temperature processes (e.g., below about 550° C., such as about 300° C. to about 450° C.) where the reactions otherwise may not occur. The embodiments described herein can enable better selectivity and control over both forward and reverse chemical reactions at the substrate surface, leading to less wafer defects and improved thickness uniformity. Embodiments described herein can also provide greater control over the fabrication of smaller devices, leading to increased performance and higher throughput.

3-nm and 5-nm technology nodes require across-the-die uniformities that are difficult to achieve with existing systems. In these systems, low thermal budgets are utilized to maintain device performance. However, when the temperature is too low, suitable deposition rates using thermal activation cannot be achieved. Embodiments described herein solve this issue by, e.g., adding energetic photons to the surface of the substrate where deposition is occurring, and allowing higher growth rates and/or throughputs at a sufficiently low substrate temperature.

Further, modification of the substrate by conventional methods typically targets bulk modification. In contrast, embodiments described herein enable surface modification of the substrate. In some embodiments, the wavelength of radiation emitted by the electromagnetic energy source is selected such that the bulk material from which the substrate is formed is substantially unmodified while the surface of the substrate is modified.

The following illustrative, but non-limiting, examples are put forth so as to provide those of ordinary skill in the art with a complete disclosure and description of how to make and use embodiments of the present disclosure, and are not intended to limit the scope of embodiments of the present disclosure.

Figure 1A:
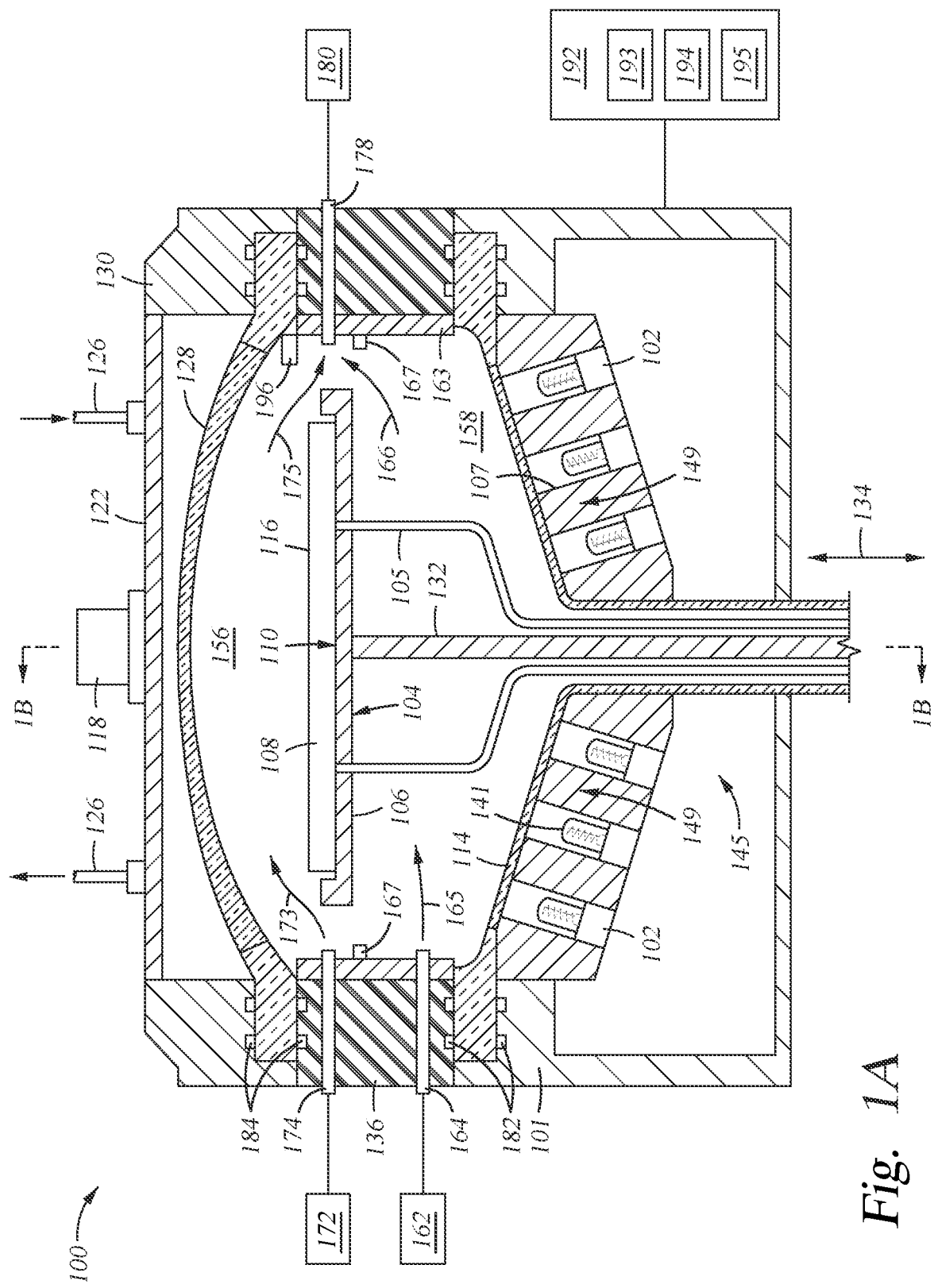
FIG. 1A illustrates a schematic sectional view of a backside heating processing chamber with a supplemental energy source according to at least one embodiment of the present disclosure.
Figure 1B:
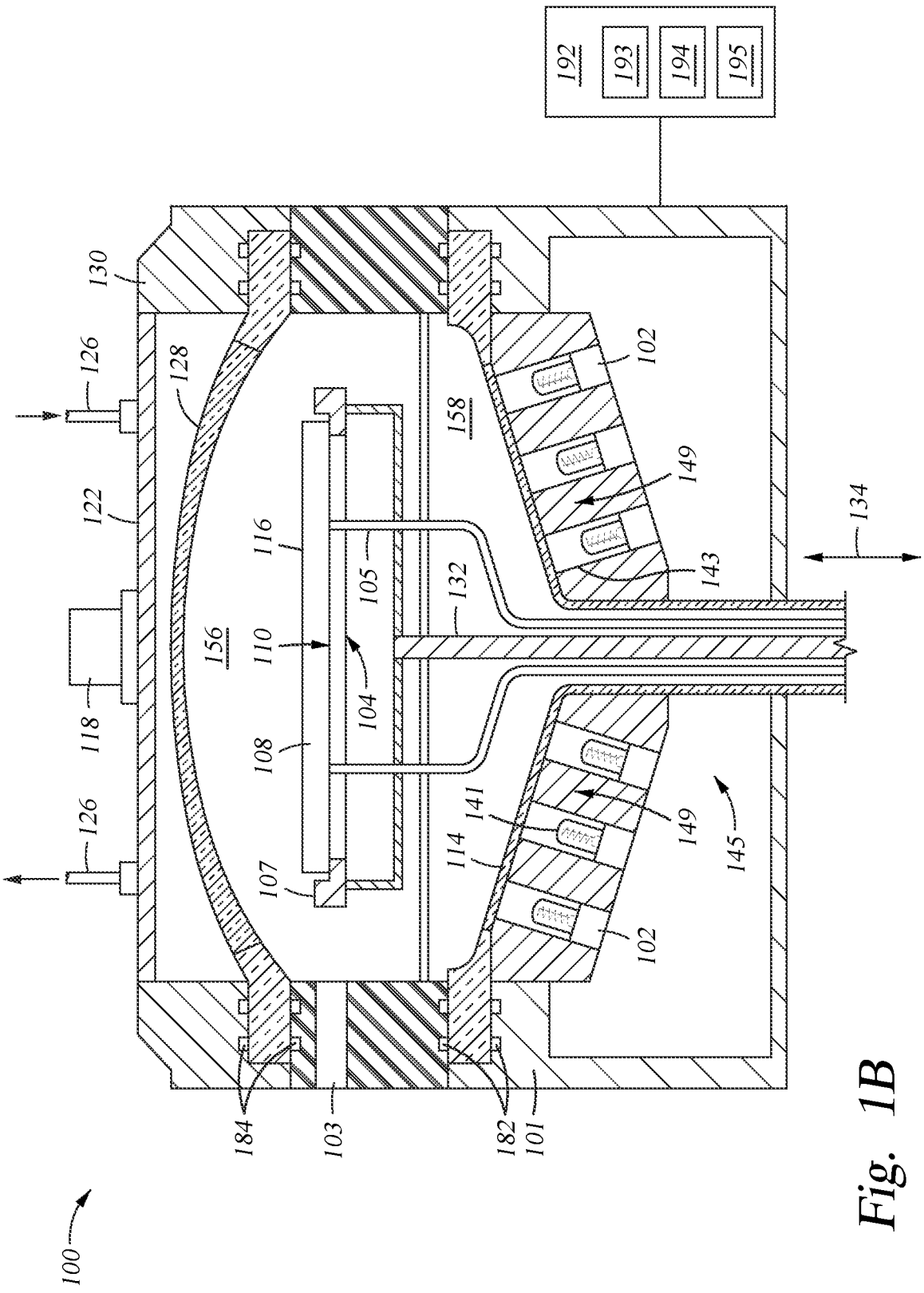
FIG. 1B illustrates a schematic side view of the processing chamber taken along line 1B-1B in FIG. 1A according to at least one embodiment of the present disclosure.

FIG. 1A illustrates a schematic sectional view of a processing chamber 100 according to at least one embodiment of the present disclosure. The processing chamber 100 is a backside heating processing chamber. FIG. 1B illustrates a schematic side view of the processing chamber 100 taken along line 1B-1B in FIG. 1A. It is noted that a liner assembly 163 and a circular shield 167 has been omitted from FIG. 1B for clarity. The processing chamber 100 may be used to process one or more substrates, including the deposition of a material on an upper surface of a substrate 108. The processing chamber 100 may include an array of radiant heating lamps 102 for heating, among other components, a back side 104 of a substrate support 106 disposed within the processing chamber 100. In some embodiments, the array of radiant heating lamps may be disposed over an upper plate 128. The substrate support may be a disk-like substrate support as shown by the substrate support 106 of FIG. 1A; or the substrate support may be a ring-like substrate support 107 with no central opening as shown in FIG. 1B, which supports the substrate from the edge of the substrate to facilitate exposure of the substrate to the thermal radiation of the lamps 102. In some embodiments, the substrate support 106 may be a multiple arm design Referring back to FIG. 1A, the substrate support 106 is located within the processing chamber 100 between the upper plate 128 and a lower plate 114. The upper plate 128, the lower plate 114, and a base ring 136 that is disposed between the upper plate 128 and the lower plate 114 generally define an internal region of the processing chamber 100. The substrate 108 (not to scale) can be brought into the processing chamber 100 and positioned onto the substrate support 106 through a loading port 103, which is obscured by the substrate support 106 in FIG. 1A but can be seen in FIG. 1B.

The substrate support 106 is shown in an elevated processing position. However, the substrate support 106 may be vertically traversed by an actuator (not shown) to a loading position below the processing position to allow lift pins 105 to contact the lower plate 114, pass through holes in the substrate support 106, and raise the substrate 108 from the substrate support 106. A robot (not shown) may then enter the processing chamber 100 to engage and remove the substrate 108 therefrom though the loading port 103. The substrate support 106 then may be actuated up to the processing position to place the substrate 108, with its device side 116 facing up, on a front side 110 of the substrate support 106.

The substrate support 106, while located in the processing position, divides the internal volume of the processing chamber 100 into a process gas region 156 that is above the substrate 108, and a purge gas region 158 that is below the substrate support 106. The substrate support 106 is rotated during processing by a central shaft 132 to minimize the effect of thermal and process gas flow spatial anomalies within the processing chamber 100 to, e.g., facilitate uniform processing of the substrate 108. The substrate support 106 is supported by the central shaft 132. The central shaft 132 moves the substrate 108 in an up and down direction 134 during loading and unloading, and in some instances, during processing of the substrate 108. The substrate support 106 may be formed from silicon carbide or graphite coated with silicon carbide to, e.g., absorb radiant energy from the lamps 102 and/or conduct the radiant energy to the substrate 108. In general, the central window portion of the upper plate 128 and the bottom of the lower plate 114 are formed from an optically transparent material such as quartz.

One or more lamps, such as an array of the lamps 102, can be disposed adjacent to and beneath the lower plate 114 in a specified, desired manner around the central shaft 132. The lamps 102 can independently control the temperature at various regions of the substrate 108 as process gas passes over, thereby facilitating the deposition of a material onto the upper surface of the substrate 108. While not discussed here in detail, the deposited material may include gallium arsenide, gallium nitride, or aluminum gallium nitride.

The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower plate 114 due in part to the close proximity of the lamphead 145 to the lower plate 114. The lamphead 145 may also cool the lamp walls and walls of the reflectors (not shown) around the lamps. Alternatively, the lower plate 114 may be cooled by a convective approach. Depending upon the application, the lampheads 145 may or may not be in contact with the lower plate 114. As noted above, and in some embodiments, the lampheads 145 may be positioned over and/or in contact with the upper plate 128. In some examples, the lamps 102 are configured to heat components of the processing chamber 100 to improve cleaning of internal surfaces of the processing chamber.

A circular shield 167 may be optionally disposed around the substrate support 106 and surrounded by the liner assembly 163. The circular shield 167 can prevent or minimize leakage of heat/light noise from the lamps 102 to the device side 116 of the substrate 108 while providing a pre-heat zone for the process gases. The circular shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the processing volume (i.e., the process gas region 156 and purge gas region 158) from metallic walls of the processing chamber 100. The metallic walls may react with precursors and cause contamination in the processing volume. While the liner assembly 163 is shown as a single body, the liner assembly 163 may include one or more liners with different configurations.

An optical pyrometer 118 may be used for temperature measurements and temperature control of the substrate support during backside heating of the substrate 108 from the substrate support 106. Temperature measurements by the optical pyrometer 118 may be performed on the substrate's device side 116 having an unknown emissivity since heating the front side 110 of the substrate support in the processing chamber 100 is emissivity independent. As a result, the optical pyrometer 118 can only sense radiation from the hot substrate 108 that conducts from the substrate support 106, with minimal background radiation from the lamps 102 directly reaching the optical pyrometer 118.

An electromagnetic energy source 122 (e.g., the electromagnetic energy source described herein) is placed outside the upper plate 128 to provide supplemental energy (e.g., photons) to the substrate. The electromagnetic energy source 122 generates radiation which enters the processing chamber 100 through one or more machined channels 126 connected to a cooling source (not shown). The one or more machined channels 126 connect to a passage (not shown) formed on a side of the electromagnetic energy source 122. The passage is configured to carry a flow of a fluid such as water and may run horizontally along the side of the electromagnetic energy source 122 in any desired pattern covering a portion or entire surface of the electromagnetic energy source 122. The substrate 108 is modified by shining light towards substrate 108 which may reorder the substrate 108 and/or assist chemical reactions involving, e.g., process gases and the substrate 108. The electromagnetic energy source 122 can assist in adsorption and/or desorption of precursors which would otherwise not be adsorbed and/or desorbed. For example, a layer such as nitride, silicide, or oxide can be grown on the substrate 108 and/or the degree of order in the substrate can be increased.

In some embodiments, the electromagnetic energy source 122 can deliver energy to one side of the substrate (e.g., the device side of the substrate). In at least one embodiment, the electromagnetic energy source 122 can deliver energy to both sides of the substrate 108.

Figure 1C:
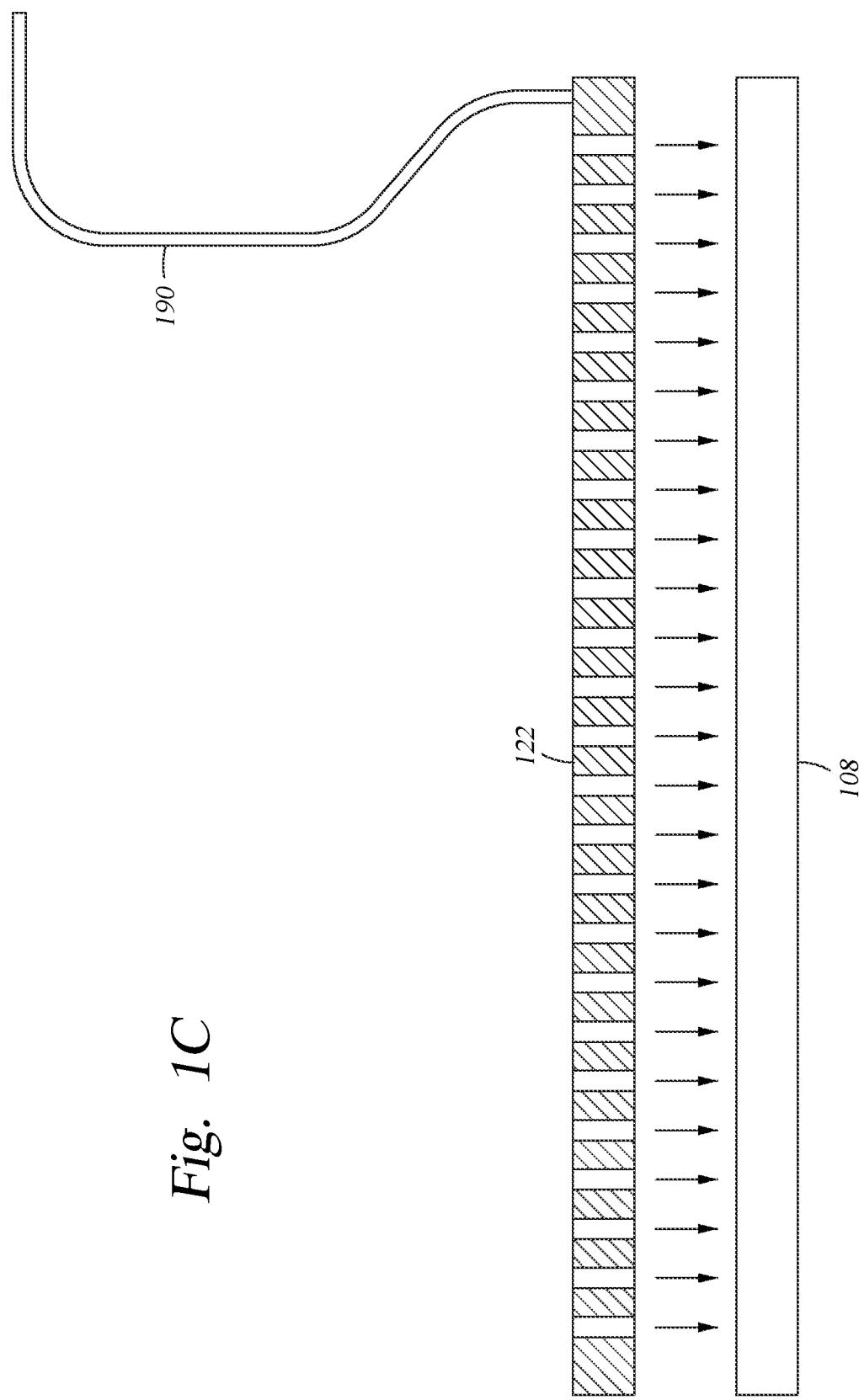
FIG. 1C is a cross-section of the energy source of FIGS. 1A and 1B to provide supplemental energy to the substrate according to at least one embodiment of the present disclosure.

FIG. 1C is a cross-section of the electromagnetic energy source 122 of FIGS. 1A-1B according to at least one embodiment. The electromagnetic energy source 122 is utilized to provide supplemental energy to the substrate. Chamber components have been removed for clarity. The electromagnetic energy source 122 is positioned above substrate 108. Electrical connections 190 are fed through a chamber lid (not shown). The electrical connections 190 deliver power to each lamp, bulb, LED, etc. of the electromagnetic energy source 122. A voltage is supplied to the electromagnetic energy source 122 which then supplies energy to a front of the substrate 108. It is contemplated that the electromagnetic energy source 122 can be positioned such that it supplies energy to a bottom of the substrate 108. It is also contemplated that there can be two electromagnetic energy sources 122, one positioned above the substrate 108 and another positioned below the substrate 108.

Referring back to FIG. 1A, process gas supplied from a process gas supply source 172 is introduced into the process gas region 156 through a process gas inlet 174 formed in the sidewall of the base ring 136. The process gas inlet 174 is configured to direct the process gas in a generally radially inward direction. During a film formation process, the substrate support 106 may be located in the processing position, which is adjacent to and at about the same elevation as the process gas inlet 174, allowing the process gas to flow along flow path 173 across the upper surface of the substrate 108 in a laminar flow fashion. The process gas exits the process gas region 156 (along flow path 175) through a gas outlet 178 located on the side of the processing chamber 100 opposite the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper plate 128 (as will be discussed in detail below), can enable a generally planar, uniform gas flow across the substrate 108. Further radial uniformity may be provided by the rotation of the substrate 108 through the substrate support 106.

A controller 192 is coupled to the processing chamber 100 in order to control the components of the processing chamber 100 as described herein. The controller 192 includes a central processing unit (CPU) 195, a memory 193, and support circuits 194 for the CPU 195. The controller 192 may be any suitable type of general-purpose computer processor that can be used in an industrial setting for controlling various chambers and sub-processors. The memory 193, or other computer-readable medium, for the CPU 195 may be one or more of any readily available memory forms, such as random access memory (RAM), read only memory (ROM), a floppy disk, a hard disk, or any other form of digital storage, local or remote. The support circuits 194 may be coupled to the CPU 195 in an effort to support the processor in a conventional manner. These circuits may include cache, power supplies, clock circuits, input/output (I/O) circuitry and subsystems, and the like. In some embodiments, the techniques disclosed herein for a deposition process as well as a cleaning regime may be stored in the memory as a software routine. The software routine may also be stored and/or executed by a second CPU (not shown) that is remotely located from the hardware being controlled by the CPU.

According to at least one embodiment, one or more operations of the apparatus and methods described herein can be included as instructions in a computer-readable medium for execution by the controller unit (e.g., controller 192) or any other processing system.

The electromagnetic energy source (e.g., the electromagnetic energy source 122) is adapted to emit energy at a wavelength or wavelength range over the ultraviolet (UV) region, visible region, and/or infrared region of the electromagnetic spectrum. By emitting electromagnetic energy, the electromagnetic energy source 122 delivers/supplies energetic photons to the substrate 108.

The electromagnetic energy source 122 can include lamp(s), bulb(s), light emitting diode(s), and combinations thereof, which emit energy/light in the UV, visible, and IR regions. Each individual lamp, bulb, or LED can be customized to emit radiation at, e.g., a specific power and specific wavelength. In addition, the energy distribution and other parameters can be customized for each lamp, bulb, or LED. The added energy is sufficient to aid, e.g., adsorption and/or desorption of precursors which would otherwise not be adsorbed and/or desorbed, or not sufficiently absorbed and/or desorbed, by thermally heating the substrate alone with a given process window. As such, utilization of the energy source provides a broader process window and allows additional energy control over small features.

Depending on the chemistries involved, delivering electromagnetic energy to the surface of the substrate in the presence of gas precursor can, e.g., enhance the rate of chemical reactions by thermal or other means. For example, the light may excite gas phase molecules, adsorbed molecules, or even electronically excite the substrate to promote a chemical reaction on the surface. The wavelength or wavelength range of energy emitted can be selected to promote desirable film processes by, for example, choosing a wavelength or wavelength range which is resonant with a molecular electronic transition in order to enhance a reaction rate. The wavelength or wavelength range can be chosen to enhance absorption of the radiation by the substrate, thereby heating the substrate more efficiently.

The electromagnetic energy source 122 is adapted to deliver energy at a wavelength or wavelength range from about 10 nm to about 1 mm. In some embodiments, the wavelength or wavelength range of UV light emitted from the electromagnetic energy source 122 is from about 10 nm to about 400 nm, the wavelength or wavelength range of visible light emitted is typically from about 400 nm to about 750 nm, and the wavelength or wavelength range of IR light is typically from about 750 nm to about 1 mm.

The electromagnetic energy delivered to the substrate from electromagnetic energy source can be a wavelength or a wavelength range. In some embodiments, the electromagnetic energy delivered has a wavelength or wavelength range that is from about 10 nm to about 400 nm, such as from about 50 nm to about 350 nm, such as from about 100 nm to about 300 nm, such as from about 150 nm to about 250 nm, such as from about 150 nm to about 200 nm or from about 200 nm to about 250 nm. In some embodiments, the electromagnetic energy delivered has a wavelength or wavelength range that is from about 400 nm to about 750 nm, such as from about 450 nm to about 700 nm, such as from about 500 nm to about 650 nm, such as from about 550 to about 600 nm. In at least one embodiment, the electromagnetic energy delivered has a wavelength or wavelength range that is from about 750 nm to about 1 mm, such as from about 800 nm to about 950 nm, such as from about 850 nm to about 900 nm. Higher or lower wavelengths or wavelength ranges are contemplated.

In some examples, a wavelength or wavelength range of UV light, IR light, and/or visible light can be used together.

Flash lamps and/or traditional rapid thermal processing (RTP) lamps can be used as the electromagnetic energy source 122. Flash lamp based systems can operate with pulse durations from about 100 microseconds ($\mu$s) to about 100 milliseconds (ms) time range, such as from about 250 $\mu$s to about 75 ms, such as from about 500 $\mu$s to about 50 ms, such as from about 750 $\mu$s to about 25 ms, such as from about 1 ms to about 10 ms, though greater or lesser durations are contemplated. Traditional RTP lamp based systems can operate with pulse durations from about 1 and about 100 seconds, such as from about 10 seconds to about 90 seconds, such as from about 20 seconds to about 80 seconds, such as from about 30 seconds to about 70 seconds, such as from about 40 seconds to about 60 seconds, such as from about 40 seconds to about 50 seconds or from about 50 seconds to about 60 seconds, though greater or lesser durations are contemplated. Additionally, or alternatively, the flash lamps and/or traditional RTP lamps can be continuously on during at least a portion of the substrate processing. The power density can be from about 1 W/cm$^2$ to about 1 MW/cm$^2$, though greater or lesser power densities are contemplated. Any number of pulses may be applied depending on the desired processing result. Gaps between pulses can be from about 100 ms to about 100 s, such as from about 500 ms to about 50 s, such as from about 1 s to about 25 s, though greater or lesser time gaps between pulses are contemplated. Suitable lamps include tungsten-halogen incandescent lamps and xenon flash lamps.

The electromagnetic energy source can include one or more LEDs. Pulse durations can be from about 1 ms to about 1 second (s), such as from about 100 ms to about 800 ms, such as from about 200 ms to about 600 ms, though greater or lesser durations are contemplated. Any suitable number of pulses may be applied depending on the desired processing result. Additionally, or alternatively, the one or more LEDs can be continuously on during at least a portion of the substrate processing. Gaps between pulses can be from about 100 ms to about 100 s, such as from about 500 ms to about 50 s, such as from about 1 s to about 25 s, though greater or lesser time gaps between pulses are contemplated. Any suitable LEDs can be used including those that emit a power density of about 200 Watts/cm$^2$ or more, such as about 500 Watts/cm$^2$ or more, such as about 1000 Watts/cm$^2$ or more, and/or less than about 1 MW/cm$^2$, though greater or lesser power densities are contemplated. In some embodiments, the one or more LEDs include those emitting blue light or UV light, e.g., less than about 500 nm.

Pulse durations can be about 1 ms or less, such as about 1 $\mu$s or less, depending on, e.g., the electromagnetic energy source.

In addition to being able to control pulse duration, repetition rate, number of repetitions and intensity, LEDs can enable the optical pulse shape to be varied by simply controlling the voltage applied to the diodes. Pulse shaping can allow the heating rate to be engineered to balance process efficiency and the stress gradients in deposited films and the substrate both during and after the process.

LEDs can also provide benefits when processing substrates outside the time region ranging from about 1 millisecond to about 1 second. In some embodiments, LEDs may be used to produce pulses under about 1 milliseconds down to the time required to initiate illumination, which may be less than about 10 microseconds. These LED pulses partially overlap the pulse regime covered by flash lamps.

In some embodiments, energy is delivered to the substrate in a continuous and/or a pulsed manner. Different amounts of energy at different wavelengths can also be delivered to the substrate. For example, a first amount of electromagnetic energy at a first wavelength (or first wavelength range) and a second amount of electromagnetic energy at a second wavelength (or second wavelength range) can be delivered simultaneously, at different times, overlapping times, cyclically, or combinations thereof. Thus a plurality of electromagnetic pulses can be delivered to the surface of the substrate if desired. Additionally, the electromagnetic energy can be selectively delivered to certain region(s) at or near the substrate surface. For example, a first wavelength or wavelength range of radiation can be delivered to a first region at or near the substrate surface, and a second wavelength or wavelength range of radiation can be delivered to a second region at or near the substrate surface. The first region can be the same region or a different region as the second region. The selectivity of the light for different regions or layers of the substrate enables areal selectivity and/or depth selectivity. Such selectivity is not obtainable utilizing conventional thermal methods alone.

Referring again to FIGS. 1A and 1B, electrical connections (not shown) supply a voltage to the electromagnetic energy source 122, e.g., the electromagnetic energy source described herein, which then provides energy to one or more regions of the substrate 108. In some embodiments, and during processing, the optical pyrometer 118 (or a plurality of optical pyrometers) sense the temperature of the substrate 108 at a variety of locations on the back and front of the substrate 108 which can be used to help determine the voltage delivered to the electromagnetic energy source 122 dynamically. Additionally, or alternatively, the temperature can be used to determine the voltage applied to the electromagnetic energy source 122 for subsequent wafers. Optical pyrometer 118 can detect light of a different wavelength than the light from the electromagnetic energy source 122 used to provide energy and chemically modify the substrate 108 resulting in a more accurate determination of substrate temperature.

In some embodiments, a removable window can be placed in front of the electromagnetic energy source 122. Here, the electromagnetic energy source can get very close to the substrate (e.g., about 10 mm or less, such as about 5 mm away from the substrate). The window prevents deposition of gases or particles on the electromagnetic energy source 122. The window can be cleaned periodically.

As described above, high-temperature substrate processing (e.g., temperatures above about 550° C., or above about 500° C.) can be undesirable for a variety of substrates. However, when the temperature is too low (e.g., below 550° C., or below 500° C.), deposition or modification processes cannot occur (or occur at an undesirably reduced rate) because of the low reactivity of the substrate, process gases, or other reactants involved in the process. That is, it may be desirable to deposit a material on a substrate having temperature-sensitive features. Moreover, even if the processes can occur at lower temperatures, suitable deposition rates using thermal activation alone cannot be achieved economically.

For example, low thermal budgets are utilized to maintain device performance of small device features such as 5-nm and 3-nm structures, among other devices. However, modifying one or more surfaces of 5-nm and 3-nm structures using conventional 5-nm and 3-nm processes at low temperatures either cannot occur or can only occur with substantially increased deposition times. Similarly, a variety of other processes used to control the surface chemistry of substrate features (e.g., aiding in the adsorption and/or desorption of precursors) also cannot occur at reasonable rates. There is currently no available technique to solve such challenges.

State-of-the-art techniques to modify substrate surfaces do exist, such as laser annealing. However, these laser annealing processes are utilized only after deposition for post-deposition processing.

Embodiments described herein overcome these and other challenges by, e.g., selectively activating reactants (precursors, substrate surfaces, etc.) using electromagnetic energy. The electromagnetic energy can enable reactions (e.g., depositions, modifications, et cetera) to occur in new process windows. Here, the electromagnetic energy, in the form of photons and/or heat, can be used to dissociate precursor materials, activate surface bonds of the substrate, or otherwise prepare reactants to undergo a reaction where the reactions otherwise may not occur or may not occur at economically-feasible rates. The electromagnetic energy can be utilized to chemically modify a precursor material (e.g., a deposition precursor), a region at or near an upper surface of the substrate, or both, during a deposition process. Furthermore, in contrast to conventional laser annealing operations that are performed after deposition of material(s), embodiments described herein can utilize electromagnetic energy during deposition.

Figure 2:
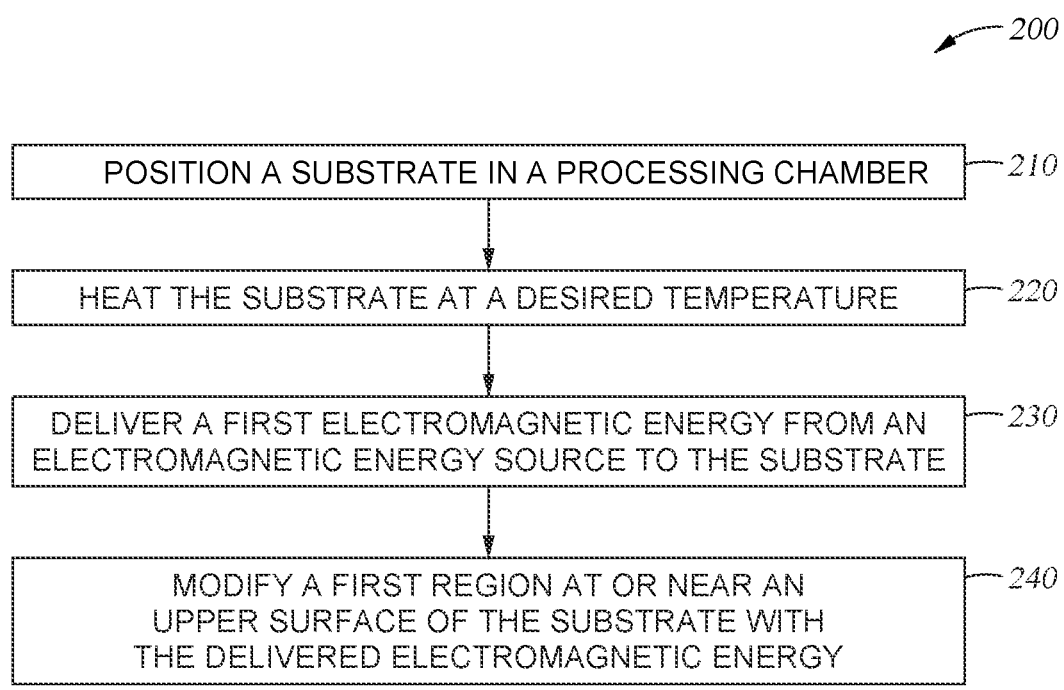
FIG. 2 is a flowchart showing selected operations of an example method for processing a substrate according to at least one embodiment of the present disclosure.

FIG. 2 is a flowchart of a method 200 of processing a substrate (e.g., the substrate 108) according to at least one embodiment of the present disclosure. The method 200 is useful to, e.g., modify the surface chemistry of the substrate during, e.g., a deposition process. In some embodiments, the method 200 is at least a portion of a method for epitaxially growing a film (such as Si, SiGe, oxides, nitrides, among others), though the method 200 can be at least a portion of other deposition processes of a variety of films such as chemical vapor deposition (CVD), electrochemical deposition (ECD), epitaxial deposition, heteroepitaxy deposition, atomic layer deposition (ALD), physical vapor deposition (PVD), or combinations thereof. The methods are not limited by substrate materials or materials deposited. For example, the methods can be applied to deposition of one or more Group 13-Group 16 elements (e.g., B, Al, Ga, In, Si, Ge, Sn, N, P, As, Sb, O, S, Se, and combinations thereof), one or more transition metals, combinations thereof, among others. Aspects herein provide for modification of surface chemistry (for example, through additional of energy to enhance chemical reactions) to facilitate improved film growth, with reduced impact on the thermal budget of the substrate. The impact on thermal budget of the substrate is reduced since the substrate is maintained at a relatively reduced temperature, while only the surface of the substrate is subject to additional thermal energy to facilitate enhanced thermal reaction.

A substrate is positioned in a processing chamber (e.g., the processing chamber 100) at operation 210. The substrate is heated at a desired temperature, e.g., below about 550° C., such as below about 500° C., such as from about 50° C. to about 250° C. or from about 200° C. to about 500° C. at operation 220. In at least one embodiment, the substrate is heated to a temperature from about 50° C. to about 600° C., such as from about 150° C. to about 550° C., such as from about 200° C. to about 500° C., such as from about 250° C. to about 500° C., such as from about 250° C. to about 500° C., such as from about 300° C. to about 500° C., such as from about 350° C. to about 500° C., such as from about 375° C. to about 475° C., such as from about 400° C. to about 450° C.

At operation 230, energy and/or light is supplied/delivered to the surface of the substrate using an example electromagnetic energy source (e.g., the electromagnetic energy source 122), which is part of the substrate processing system, described herein. The energy/light modifies a region at or near an upper surface of the substrate with the delivered electromagnetic energy at operation 240. "At or near an upper surface of the substrate" refers to a distance from the surface of the substrate to an inner portion of the substrate. In some examples, this distance from the surface of the substrate to an inner portion of the substrate is about 100 nm or less, such as about 90 nm or less, such as about 80 nm or less, such as about 70 nm or less, such as about 60 nm or less, such as about 50 nm or less, such as about 45 nm or less, such as about 40 nm or less, such as about 35 nm or less, such as about 30 nm or less, such as about 25 nm or less, such as about 20 nm or less, such as about 15 nm or less, such as about 10 nm or less, such as about 9 nm or less, such as about 8 nm or less, such as about 7 nm or less, such as about 6 nm or less, such as about 5 nm or less. Other distances are also contemplated. Energies, wavelengths, number of pulses, pulse duration, and intensity, among other parameters, can be selected to sufficiently modify the substrate surface. For example, a first electromagnetic energy having a wavelength or wavelength range in the UV region of the electromagnetic spectrum is emitted from the electromagnetic energy source and delivered to the substrate. Subsequently, a second electromagnetic energy having a wavelength or wavelength range in the IR region of the electromagnetic spectrum is emitted from the electromagnetic energy source and delivered to the substrate.

In some embodiments, an optical detector 196 is used to detect a threshold at which a parameter of the electromagnetic energy source is adjusted and/or caused to emit radiation. Adjusting a parameter can take the form of changing the wavelength of energy emitted by the electromagnetic energy source. Such embodiments enable real-time feedback for substrate processing. As an example, the optical detector can be utilized to change from a first electromagnetic energy (or other first parameter) to a second electromagnetic energy (or other second parameter).

In some embodiments, a controller (e.g., controller 192) is used to determine or adjust one or more parameters of the electromagnetic energy source based on a temperature reading of the substrate (by, e.g., optical pyrometer 118) and/or an optical reading (by, e.g., optical detector 196). The controller can determine a voltage applied to the one or more electromagnetic energy sources based on the temperature reading and/or optical reading.

The method can further include selecting a pulse duration and/or pulse intensity sufficient to treat the substrate with at least one pulse of light/energy from the electromagnetic energy source. The at least one pulse of light includes one or more wavelengths or wavelength ranges. The method can further include depositing a layer (e.g., a Si-containing layer, a Ge-containing layer, an oxide layer, a nitride layer, a transition metal-containing layer) via atomic layer deposition, epitaxy, chemical vapor deposition, plasma chemical vapor deposition, or other suitable deposition methods. That is, the methods described herein can be utilized with a variety of deposition methods. The methods described herein can be utilized to fabricate 3D LEDs.

The electromagnetic energy source and methods of using the electromagnetic energy source enable surface modification of substrates when, e.g., high-temperature substrate processing is undesirable. As a result, the energy from the electromagnetic energy source enables a broader process window for low-temperature processes (e.g., below about 550° C., such as from about 300° C. to about 450° C.) where substrate surface modification would otherwise not occur.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments, and advantages are merely illustrative and are not considered elements or limitations of the appended claims except where explicitly recited in a claim(s). Likewise, reference to "the disclosure" shall not be construed as a generalization of any subject matter disclosed herein and shall not be considered to be an element or limitation of the appended claims except where explicitly recited in a claim(s).

As used herein, the indefinite article "a" or "an" shall mean "at least one" unless specified to the contrary or the context clearly indicates otherwise.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

While the foregoing is directed to embodiments of the present disclosure, other and further embodiments of the disclosure may be devised without departing from the basic scope thereof, and the scope thereof is determined by the claims that follow.

What is claimed is:

1. A substrate modification method, comprising:
positioning a substrate within a processing chamber; and
depositing a material on a portion of the substrate by a deposition process, the deposition process comprising:
thermally heating the substrate to a temperature of less than about 500° C.;
delivering a first electromagnetic energy from an electromagnetic energy source to the substrate to modify a first region of the substrate, at or near an upper surface of the substrate, without increasing the temperature of a bulk of the substrate; and
depositing the material on the first region while delivering the first electromagnetic energy.

2. The method of claim 1, further comprising selecting the first electromagnetic energy that modifies the first region of the substrate without substantially modifying a bulk of the substrate.

3. The method of claim 1, wherein the electromagnetic energy source comprises a light emitting diode, an ultraviolet lamp, an infrared lamp, or combinations thereof.

4. The method of claim 1, further comprising delivering a second electromagnetic energy from the electromagnetic energy source to the substrate to chemically modify a second region at or near the upper surface of the substrate, the first region and the second region being the same or different regions.

5. The method of claim 4, wherein the second electromagnetic energy is of a higher wavelength than the first electromagnetic energy.

6. The method of claim 4, wherein the first electromagnetic energy is ultraviolet light and the second electromagnetic energy is infrared light.

7. The method of claim 4, wherein the first electromagnetic energy, the second electromagnetic energy, or both, are in the form of temporally shaped pulses.

8. The method of claim 7, wherein:
pulses of the first electromagnetic energy, pulses of the second electromagnetic energy, or both, are varied as a function of time;
a duration of each pulse is about 1 second or less; or
a combination thereof.

9. The method of claim 7, wherein the deposition process comprises chemical vapor deposition, electrochemical deposition, epitaxial deposition, heteroepitaxy deposition, atomic layer deposition, physical vapor deposition, or combinations thereof.

10. The method of claim 1, wherein thermally heating the substrate at a temperature of less than about 500° C. alone does not substantially alter the first region of the substrate.

11. The method of claim 1, further comprising selecting a pulse duration and pulse intensity sufficient to modify the first region of the substrate.

12. The method of claim 1, wherein the deposition process is an epitaxial deposition process.

13. The method of claim 1, wherein the electromagnetic energy source delivers photons to the substrate without additional heat to a bulk of the substrate.

14. The method of claim 1, further comprising delivering a second electromagnetic energy from the electromagnetic energy source to the material to chemically modify the material during the depositing of the material on the substrate.

15. A method of processing a substrate, comprising:
positioning the substrate within a processing chamber; and
depositing a layer on a portion of the substrate, wherein depositing a layer comprises:
thermally heating the substrate to a temperature of less than about 500° C.;
delivering a first electromagnetic energy from an electromagnetic energy source to the substrate to modify a first region at or near an upper surface of the substrate without increasing the temperature of a bulk of the substrate;
depositing a first layer on the first region while delivering the first electromagnetic energy;
delivering a second electromagnetic energy from the electromagnetic energy source to the substrate to modify a second region at or near an upper surface of the substrate without increasing the temperature of the bulk of the substrate, the second region and the first region being the same or different region; and
depositing a second layer on the second region while delivering the first electromagnetic energy.

16. The method of claim 15, wherein the electromagnetic energy source comprises a light emitting diode, an ultraviolet lamp, an infrared lamp, or combinations thereof.

17. The method of claim 15, wherein the second electromagnetic energy is of a higher wavelength than the first electromagnetic energy.

18. The method of claim 15, wherein the first electromagnetic energy is ultraviolet light and the second electromagnetic energy is infrared light.

19. The method of claim 15, wherein:
the first electromagnetic energy, the second electromagnetic energy, or both, are in the form of temporally shaped pulses;
a pulse of the first electromagnetic energy, a pulse of the second electromagnetic energy, or both, are varied as a function of time; or
a combination thereof.

20. The method of claim 16, wherein a duration of each pulse is 1 second or less.

21. An apparatus for modifying a surface of a substrate, the apparatus comprising:
a substrate processing chamber;
a thermal heating source to heat the substrate at a temperature of less than about 500° C., the thermal heating source configured to heat a backside of the substrate; and
an electromagnetic energy source to emit electromagnetic energy during a deposition process, the electromagnetic energy configured to modify a deposition precursor, a region at or near an upper surface of the substrate, or both, during the deposition process without increasing the temperature of a bulk of the substrate.

22. The apparatus of claim 21, wherein the electromagnetic energy source comprises an ultraviolet lamp, an infrared lamp, a light emitting diode, or combinations thereof.

23. The apparatus of claim 21, further comprising:
a pyrometer to sense a temperature of the substrate at which a first parameter of the electromagnetic energy source is adjusted or caused to emit radiation;
an optical detector to detect a threshold at which a second parameter of the electromagnetic energy source is adjusted or caused to emit radiation; and
a controller to determine and adjust the first parameter and second parameter of the electromagnetic energy source.

* * * * *